(12) United States Patent
Hsu et al.

(10) Patent No.: US 9,320,125 B2
(45) Date of Patent: Apr. 19, 2016

(54) PLASMA DEVICE

(71) Applicant: Creating Nano Technologies, Inc., Tainan (TW)

(72) Inventors: Yi-Ming Hsu, Tainan (TW); Li-Min Wang, Tainan (TW); An-Jen Li, Tainan (TW)

(73) Assignee: Creating Nano Technologies, Inc., Tainan (TW)

( * ) Notice: Subject to any disclaimer, the term of this patent is extended or adjusted under 35 U.S.C. 154(b) by 33 days.

(21) Appl. No.: 14/509,051

(22) Filed: Oct. 8, 2014

(65) Prior Publication Data
US 2015/0303034 A1 Oct. 22, 2015

(30) Foreign Application Priority Data
Apr. 16, 2014 (TW) .............................. 103113891 A

(51) Int. Cl.
*H01J 37/32* (2006.01)
*H05H 1/34* (2006.01)

(52) U.S. Cl.
CPC ............ *H05H 1/34* (2013.01); *H01J 37/32055* (2013.01); *H01J 37/32449* (2013.01); *H01J 37/32596* (2013.01); *H01J 2237/006* (2013.01); *H05H 2001/3463* (2013.01); *H05H 2001/3468* (2013.01)

(58) Field of Classification Search
None
See application file for complete search history.

(56) References Cited

U.S. PATENT DOCUMENTS

| | | | |
|---|---|---|---|
| 4,558,201 A | 12/1985 | Hatch | |
| 5,132,512 A | 7/1992 | Sanders et al. | |
| 5,317,126 A * | 5/1994 | Couch, Jr. ................ | H05H 1/34 219/121.48 |
| 5,747,767 A * | 5/1998 | Severance ................ | H05H 1/28 219/121.48 |
| 5,808,270 A * | 9/1998 | Marantz .................. | B05B 7/224 219/121.47 |
| 6,262,386 B1 | 7/2001 | Fornsel | |
| 2014/0262034 A1 * | 9/2014 | Ishibashi ........... | C23C 16/45563 156/345.29 |

FOREIGN PATENT DOCUMENTS

| | | |
|---|---|---|
| CN | 202411644 | 9/2012 |
| TW | M426456 | 4/2012 |

* cited by examiner

*Primary Examiner* — Ashok Patel
(74) *Attorney, Agent, or Firm* — Jianq Chyun IP Office

(57) ABSTRACT

A plasma device including a casing, a first electrode, a second electrode, a nozzle and a gas ejection port is provided. The casing has a first chamber. The first electrode is disposed within the first chamber and has a second chamber. The second electrode capable of rotating in relative to the casing has a third chamber connected with the second chamber. The second chamber and the third chamber are adapted for accommodating plasma formed between the first electrode and the second electrode. The nozzle and the gas ejection port are independently disposed at the bottom of the second electrode respectively, wherein the nozzle is configured to eject the plasma, and forms an included angle with or is spaced a distance apart from a rotating axis of the second electrode. The gas ejection port is configured to eject cold gas.

15 Claims, 12 Drawing Sheets

PLASMA DEVICE

CROSS-REFERENCE TO RELATED APPLICATION

This application claims the priority benefit of Taiwan application serial no. 103113891, filed on Apr. 16, 2014. The entirety of the above-mentioned patent application is hereby incorporated by reference herein and made a part of this specification.

BACKGROUND OF THE INVENTION

1. Field of the Invention

The invention relates to a plasma device, and more particularly, to an atmospheric plasma device.

2. Description of Related Art

With the development of plasma technology, atmospheric arc plasma in the plasma has been widely applied to various fields of surface treatment. For example, the atmospheric arc plasma may be used to perform a surface treatment to an object to be treated, so as to enhance a reliability for performing a process, such as adhering, printing, packaging or epitaxizing, on a surface of this object. However, as being restricted by negative resistance characteristics of an electric arc, a process range of this type of atmospheric arc plasma is limited, and thus is unable to simultaneously produce a large area arc discharge. Although a discharge density of the atmospheric arc plasma is relatively higher and causes more active substances to be produced by this plasma technique, so that a speed of the plasma treatment may be raised (it requires only a short amount of time to complete the surface treatment for a scanning area), large area arc discharge characteristic is unable to be produced, and thus the application of this type of atmospheric arc plasma is still being limited.

In order to improve the applicability of the atmospheric arc plasma, U.S. Pat. No. 6,262,386 and TW Patent No. M426456 each discloses a plasma device, wherein an arc plasma nozzle titles an angle in relative to an axis of the plasma device, and the nozzle may rotate circumferentially around the axis so as to increase an ejection area of the plasma, thereby attaining an effect of large area surface treatment. However, at the same time of rotating the nozzle to expand the effective surface area of the plasma treatment, it is required to supply the plasma device with more power, so that enough amount of the required plasma may be produced. However, as high power is being applied, a temperature of the plasma also rises and thereby influences the performance of the plasma in performing the surface treatment to the object being treated, especially for heat sensitive objects, such as flexible substrate and so forth. Therefore, how to retain the performance of the plasma treatment while controlling the temperature of a substrate is one of the issues that have to be conquered in the field of plasma device. Moreover, in addition to the problem of unable to effectively lower the temperature of the plasma, a rod-shaped inner electrode as disclosed by U.S. Pat. No. 6,262,386 is also apt to be damaged due to the plasma being concentrated on a single point, especially when high power is being applied, and thereby influences a reliability of the device.

SUMMARY OF THE INVENTION

The invention is directed to a plasma device capable of performing a large area surface treatment and having favorable reliability and performance.

The plasma device of the invention includes a casing, a first electrode, a second electrode, a nozzle and a gas ejection port, wherein shapes of the first electrode and the second electrode are not limited, and may be tubular, rod-shaped or other shapes. In the present disclosure, the first electrode and the second electrode are, for example, depicted as a first tubular electrode and a second tubular electrode, but the invention is not limited thereto. The casing has a first chamber. The first tubular electrode is disposed in the first chamber and has a second chamber. The second tubular electrode has a third chamber connected with the second chamber. The second tubular electrode can rotate in relative to the casing, and the second chamber and the third chamber are adapted for accommodating a plasma formed between the first tubular electrode and the second tubular electrode. The nozzle and the gas ejection port are independently disposed at the bottom of the second tubular electrode respectively. The nozzle is configured to eject the plasma and forms an included angle with or is spaced a distance apart from a rotating axis of the second tubular electrode, and the gas ejection port is configured to eject a cold gas.

In an embodiment of the invention, the plasma device may further include an insulating lining, a first gas channel and a first swirling flow generator, wherein the insulating lining is located between the first tubular electrode and the casing. The first gas channel is formed between the insulating lining and the first tubular electrode and is adapted for a first gas to pass through. The first swirling flow generator is disposed at a joint between the first tubular electrode and the second tubular electrode, wherein the first swirling flow generator includes at least one first connection port configured to guide the first gas into the second chamber and the third chamber and to generate a swirling flow within the second and the third chambers, and the swirling flow pushes an arc root formed within the first tubular electrode and the second tubular electrode, so as to enable the arc root to perform a spiral motion on internal surfaces of the first tubular electrode and the second tubular electrode. More specifically, the first gas channel may further extend to and between the second tubular electrode and the casing, so as to be connected with the gas ejection port.

In an embodiment of the invention, the plasma device may also include a second gas channel formed between the casing and the insulating lining, and is adapted for a second gas to pass through, wherein the second gas channel further extends to and between the second tubular electrode and the casing and is connected with the gas ejection port. Now, the first gas and the second gas may be a same gas, and the plasma device may further include a swirling flow distributor located in a transmission path of the first gas and the second gas within the first gas channel and the second gas channel, for regulating a ratio between the cold gas ejected from the gas ejection port and the working gas that enters into the second chamber and the third chamber.

In an embodiment of the invention, the nozzle and the gas ejection port are separately disposed at opposite sides of the bottom of the second tubular electrode, and when performing a treatment to an object being treated, the plasma and the cold gas may respectively be guided to opposite sides of a surface of the object being treated. In other embodiments, the nozzle and the gas ejection port may be different openings at a same side of the bottom of the second tubular electrode. Specifically, the plasma and the cold gas are guided to the surface of the object being treated from the different openings at the bottom of the second tubular electrode, such that the nozzle and the gas ejection port are openings, with a same radial direction but different radii, located at the bottom of the second tubular electrode. Certainly, in other embodiments, the gas ejection port and the nozzle may firstly be jointed with each other within the bottom of the second tubular electrode, so as to enable the plasma and the cold gas to flow together to the nozzle at the bottom of the second tubular electrode and to be ejected from a same outlet. In this circumstance, the plasma and the cold gas may be guided from the same outlet to a same side on the surface of the object being treated.

In an embodiment of the invention, the plasma device further includes at least one intake port. The at least one intake port is disposed on the second tubular electrode and connected with the gas ejection port. In this circumstance, the plasma device may further include a gas valve shell, the at least one intake port is disposed on the tubular electrode through the gas valve shell, and a third gas channel is formed between the at least one intake port and the gas ejection port.

In an embodiment of the invention, the plasma device further includes a heat dissipation blade unit. The heat dissipation blade unit is disposed on the second tubular electrode, wherein the cold gas is injected by the heat dissipation blade unit and then guided into the at least one intake port.

In an embodiment of the invention, the cold gas is an inert gas. Certainly, the cold gas in other embodiments may also be a gas capable of reacting with the plasma, and the object being treated may be performed a coating process or an etching process with an injection of reactive gas.

In an embodiment of the invention, a second swirling flow generator is further provided. The second swirling flow generator covers on the first tubular electrode, wherein the second swirling flow generator includes at least one second connection port configured to guide the working gas within the first gas channel into the second chamber and the third chamber. Specifically, the first swirling flow generator or the second swirling flow generator may enable the working gas to be injected via a tangential path, and enable the swirling flow to be generated within the second and the third chambers.

In an embodiment of the invention, the second tubular electrode may be jointed to an external side face at the bottom of the casing through a shaft bearing, nozzle is fixed on a rotating portion of the second electrode, and the rotating portion of the second electrode and the nozzle rotate around the casing. In addition, the plasma device may further include a transmission device installed on the external side face of the second tubular electrode, for driving the second electrode and the nozzle into rotation.

In an embodiment of the invention, the first tubular electrode, the second tubular electrode and the nozzle may be disposed concentrically or nonconcentrically.

In an embodiment of the invention, the plasma device is adapted to perform a treatment to an object being treated, wherein a gas shape of the cold gas ejected on the surface of the object being treated may be long and narrow or an arc. In addition, when the cold gas is ejected along a first region on the surface of the object being treated while the plasma is ejected along a second region on the surface of the object being treated, the first region is, for example, treated in a manner of surrounding the second region.

In an embodiment of the invention, the plasma device further includes a non-DC power supply. The non-DC power supply is electrically connected with the first tubular electrode and the casing, so as to apply voltage.

In view of the foregoing, the plasma device of the invention, by separately disposing an independent gas ejection port beside the nozzle of the rotatable plasma, in addition to achieving a high performance of a large area surface treatment effect, may also timely introduce airflow to cool down the object being treated, even if it is a heat sensitive object, and may further effectively lower a surface temperature of the object being treated, so that the object being treated can undergo a high performance plasma surface treatment within a short time, thereby enabling the high performance plasma surface treatment not to be limited and influenced by the material of the object being treated.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
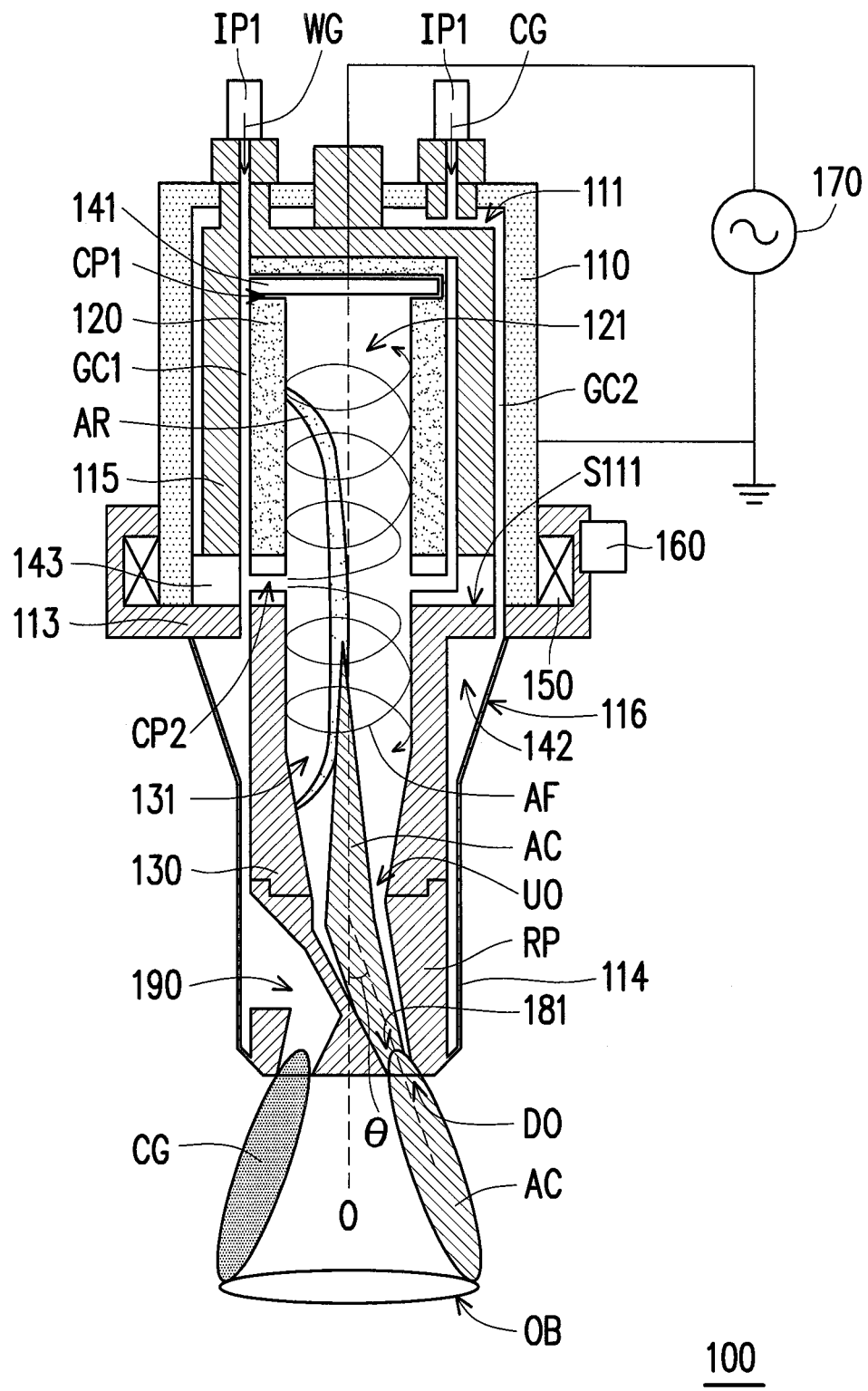
FIG. 1 is a schematic diagram illustrating architecture of a plasma device according to an embodiment of the invention.

In view of the foregoing problems, the invention effectively solves these problems by disposing a gas ejection port nearby a plasma ejection outlet of a plasma device. Furthermore, implementations of a first electrode and a second electrode in the plasma device that are configured for generating the plasma are not limited to the shapes disclosed in the present embodiment, such that the first electrode and the second electrode may be tubular, rod-shaped or other shapes. Except that, when the first electrode and the second electrode are a tubular first tubular electrode and a tubular second tubular electrode, damages in the electrodes can effectively be avoided and reliability of the device may be enhanced. FIG. 1 is a schematic diagram illustrating architecture of a plasma device according to an embodiment of the invention. Referring to FIG. 1, in the present embodiment, a plasma device 100 includes a casing 110, a first tubular electrode 120, a second tubular electrode 130, a first gas channel GC1, a second gas channel GC2, a plurality of intake ports IP1, at least one swirling flow generator 141 and 143, a nozzle 181, and a gas ejection port 190. For example, in the present embodiment, the plasma device 100 is an electric arc atmospheric plasma device 100. The casing 110 is then, for example, composed of metal or stainless steel or other proper conductive material. In addition, as shown in FIG. 1, in the present embodiment, the plasma device 100 includes two swirling flow generators 141 and 143, but the invention is not limited thereto. In other embodiments, the plasma device 100 may also only include a single swirling flow generator.

Specifically, as shown in FIG. 1, in the present embodiment, the casing 110 is a tubular structure surroundingly disposed outside of the first tubular electrode 120, so that a chamber 111 (viz. first chamber) is constituted between the casing 110 and the first tubular electrode 120. An insulating lining 115 encircling the first tubular electrode 120 is disposed in the chamber 111, and a material of the insulating lining 115 may, for example, be Teflon, polyetheretherketone (PEEK) or ceramic. Moreover, the chamber 111 outside of the insulating lining 115 may be used as a gas channel. In more detail, an upper bottom 113 of the casing 110 is jointed to the base of the chamber 111. As shown in FIG. 1, the casing 110 of the present embodiment further include an airflow shroud 116 extending downwardly from the upper bottom 113, and the upper bottom 113 is a portion whereby the casing 110 starts to shrink, such that an internal diameter of the casing 110 gradually decreases from the upper bottom 113 to a lower bottom 114, thereby causing the airflow shroud 116 of the casing 110 to form a chamber 142 having a funnel-like shape between the upper bottom 113 and the lower bottom 114. Besides, in the present embodiment, the casing 110 is an overall casing.

On the other hand, the first tubular electrode 120 is disposed in the chamber 111 of the casing 110, and the first tubular electrode 120 is a hollow tubular structure having a chamber 121 (viz., second chamber). In the present embodiment, the second tubular electrode 130, as well as due to having a hollow tubular structure, also having a chamber 131 (viz., third chamber), and this chamber 131 is connected with the chamber 121 of the first tubular electrode 120, wherein a space constituted thereby is used to accommodate an arc root AR and a plasma AC formed when the plasma device is activated.

In the present embodiment, the plasma device 100 has two gas channels surroundingly disposed outside of the first tubular electrode 120 respectively; as shown in FIG. 1, from the inside to the outside, which respectively are a first gas channel GC1 formed between the first tubular electrode 120 and the insulating lining 115 and a second gas channel GC2 formed between the insulating lining 115 and the casing 110. The first gas channel GC1 and the second gas channel GC2 communicated with external gas sources respectively through the intake ports IP1, wherein the intake ports IP1 are disposed above the casing 110. In addition, in the present embodiment, the first gas channel GC1 and the second gas channel GC2 may further extend to and between the second tubular electrode 130 and the casing 110, so as to be connected with the gas ejection port 190.

Specifically, the first gas channel GC1 and the second gas channel GC2 are respectively adapted for a first gas WG and a second gas CG to pass through, and proper types of gases may be injected thereinto based on the process needs, wherein the gases injected into the two gas channels may be the same or different. Taking the embodiment shown in FIG. 1 for an example, the first gas WG may be injected from the first gas channel GC1 through the connection port CP2 and then into the chamber 121 and the chamber 131, and when voltage is applied between the first tubular electrode 120 and the second tubular electrode 130, the first gas WG may be used as a working gas for activating the arc root AR and the plasma AC. On the other hand, the second gas CG may be injected into the second gas channel GC2, and the second gas CG passes through the funnel-shaped chamber 142 and is ejected from the bottom of the second tubular electrode through the gas ejection port 190, such that cold gas is ejected to the object being treated so as to cool down the temperature of a high performance plasma treatment. In the present embodiment, a portion of the first gas WG that is used as the working gas may also be guided to the gas ejection port 190 and be used as the cold gas, wherein the types of the first gas WG and the second gas CG may be the same, or different, based on the process needs. Certainly, the first gas WG and the second gas CG may also each operate independently, and the invention is not limited thereto.

For example, as shown in FIG. 1, since the first gas channel GC1 is connected with the gas ejection port 190 through the funnel-shaped chamber 142 at nearby the connection port CP2, and the second gas channel GC2 is connected with the gas ejection port 190 through the funnel-shaped chamber 142 shown in the right side of FIG. 1, the second gas CG of the present embodiment may be guided into the first gas channel GC1 and its connected gas ejection port 190 through the second gas channel GC2. In addition, the gas ejection port 190 and the nozzle 181 of the present embodiment are independently disposed at opposite sides of the bottom of the second tubular electrode 130, wherein the nozzle 181 is configured to eject the plasma AC, and the gas ejection port 190 is configured to eject the second gas CG. As such, in an operating mode, the plasma AC and the second gas CG may respectively be guided to opposite sides at the surface of the object being treated OB, so that the plasma AC may perform required surface treatments, such as cleaning, coating, etching, or activating passivating surface energy, to the object being treated OB.

Moreover, in the present embodiment, when the second gas CG and the first gas WG are a same gas, the plasma device 100 may additionally be disposed with a swirling flow distributor (not shown) in a transmission path of the second gas CG and the first gas WG within the first gas channel GC1 and the second gas channel GC2, so as to regulate a ratio between the second gas CG, which is ejected from the gas ejection port as the cold gas, and the first gas WG, which enters into the second chamber 121 and the third chamber 131 as a working gas. For instance, the swirling flow distributor regulates the ratio between the second gas CG and the first gas WG by means of controlling the relative amounts of the second gas CG and the first gas WG based on aperture sizes thereof. As such, the exiting types of gases may be used while taking into account of the performance of the plasma treatment to the object being treated, and the second gas CG may be used to attain an effect of cooling the surface of the object being treated.

On the other hand, in the present embodiment, since the first gas WG may flow within the first gas channel GC1 and may flow towards the funnel-shaped chamber 142 surroundingly disposed outside of the second tubular electrode 130, the injection and the flowing of the first gas WG may also be used to cool down the operating first tubular electrode 120 and the second tubular electrode 130, thereby providing an air cooling effect; certainly, the second gas CG that flows to the chamber 142 may also provide an air cooling effect. In short, by using the air cooling effects provided by the first gas WG and the second gas CG, working temperatures of the first tubular electrode 120 and the second tubular electrode 130 may be effectively lowered without requiring an additional cooling system, and thus the resulting plasma AC may be more stable and retained in a high-energy state, thereby enhancing the performance and the stability in treating the object being treated OB and effectively prolonging the service lives of the first tubular electrode 120 and the second tubular electrode 130.

The swirling flow generator 143 of the present embodiment is fixed on a bottom surface S111 of the chamber 111 of the casing 110, and the swirling flow generator 143 is located at a gap at a joint between the first tubular electrode 120 and the second tubular electrode 130, so that the working gas passing through the first gas channel GC1 may be injected into the chamber 121 and the chamber 131 by the swirling flow generator 143 through the connection port CP2 in a manner of swirling flow, so as to provide the gas that forms the arc root AR and the plasma AC. As shown in FIG. 1, the other swirling flow generator 141 is disposed above the first tubular electrode 120; and in the present embodiment, an intake ports or a connection port (ex. CP1) may also be disposed above the first tubular electrode 120 and nearby the swirling flow generator 141. During a period of forming the arc plasma, it is conducive to stabilize the electric arc and the plasma in moving towards the nozzle by injecting gas through the intake ports or this intake ports connection port CP1, and thus may effectively prevent the arc plasma from being accumulated above the first tubular electrode 120 when the size of the first tubular electrode 120 is required to be further reduced.

On the other hand, as shown in FIG. 1, in the present embodiment, the plasma device 100 may further include a non-DC power supply, such as a non-DC power supply 170. The non-DC power supply 170 is electrically connected with the first tubular electrode 120, in which the first tubular electrode 120 is a high voltage terminal and the second tubular electrode is a ground terminal or a relative low voltage terminal, so that a voltage difference may be formed between the first tubular electrode 120 and the second tubular electrode 130, and thereby activating the arc root AR and generating the plasma AC. Moreover, in the present embodiment, since the first tubular electrode 120 is jointed on the swirling flow generator 143, in order to electrically insulate the swirling flow generator 143 from the casing 110, the swirling flow generator 143 may be composed of metal and insulating material, or be constituted by simply the insulating material, wherein the insulating material that constitutes the swirling flow generator 143 may be PEEK. On the other hand, the swirling flow generator 141 may also be constituted by metal and insulating material, but the material of the swirling flow generator 141 is preferably metal.

In more detail, the first gas WG, after entering the chamber 121 from the swirling flow generator 143 as the swirling flow, flows upwards and downwards respectively along an inner side face of the first tubular electrode 120 at the top, an inner side face of the upper bottom 113 of the casing 110 at the bottom and an inner side face of the second tubular electrode 130, and forms the swirling flow AF. Now, the first tubular electrode 120 and the second tubular electrode 130, as being applied with voltage, generate the arc root AR. The arc root AR may ionize the swirling flow AF, so that the first gas WG produces an activation reaction and thereby forming the plasma AC in the chamber 121 and the chamber 131.

Furthermore, in the present embodiment, the swirling flow AF formed by the first gas WG pushes the arc root AR formed within the first tubular electrode 120 and the second tubular electrode 130, so that the arc root AR performs a spiral motion around the chamber 121 of the first tubular electrode 120 and the chamber 131 of the second tubular electrode 130. Then, the plasma AC transformed from the first gas WG is ejected out of the nozzle after being guided from within the plasma device 100 to the nozzle 181, so as to perform a plasma treatment to the object being treated OB.

As shown in FIG. 1, the second tubular electrode 130, for example, is jointed to an external side face of the upper bottom 113 of the casing 110 through a shaft bearing 150. In the present embodiment, since a material of the shaft bearing 150 may be metal, voltage potentials of the second tubular electrode 130 and the nozzle 181 may be transmitted to the casing 110 through the shaft bearing 150. Furthermore, in the present embodiment, the nozzle 181 is disposed on a rotating portion RP at the bottom of the second tubular electrode 130 by means of non-shaft bearing, namely, the nozzle 181 may rotate in relative to the casing via the rotating portion RP (connected with the nozzle 181) of the second tubular electrode 130. As such, an ejection area of the gas ejected from the nozzle 181 is increased, thereby achieving an effect of large area surface treatment.

Moreover, in the present embodiment, the nozzle 181 is spaces a distance apart from a rotating axis O of the second tubular electrode 130. Furthermore, in the present embodiment, the nozzle 181 is also disposed underneath the second tubular electrode 130 by means of tilting, and thus an opening DO under the nozzle 181 has an included angle $\theta$ with the rotating axis O of the second tubular electrode 130. In same examples, the included angle $\theta$ is greater than 0 degree but less than 90 degrees. For example, the first tubular electrode 120, the second tubular electrode 130 and the nozzle 181 may be concentric. Namely, an axis connecting with the second tubular electrode 130 and an opening UO above the nozzle 181 may align with the first tubular electrode 120 and the axis of the second tubular electrode 130, but the invention is not limited thereto. In another embodiment, the first tubular electrode 120, the second tubular electrode 130 and the nozzle 181 may also be nonconcentric. For example, axes of the first tubular electrode 120 and the second tubular electrode 130 may be different, but may be the same as the axis of the opening UO above the nozzle 181; or, the axis of the opening UO above the nozzle 181 is different from the axes of the second tubular electrode 130 and the first tubular electrode 120; or, the axes of the first tubular electrode 120, the second tubular electrode 130 and the opening UO above the nozzle 181 are all different.

Besides, the plasma device 100 may also selectively include a transmission device 160 according to practical application requirements, wherein the transmission device 160 may, for example, be a belt ring, a gear or so forth. In more detail, as shown in FIG. 1, the transmission device 160 is disposed on an external side face of the second tubular electrode 130 nearby the shaft bearing 150, so as to drive the second tubular electrode 130, the nozzle 181 and the gas ejection port 190 to rotate circumferentially in relative to the casing 110, but the invention is not limited thereto. The transmission means may also be driving a transmission member by using a transmission device, such as a motor, and then using the transmission member to drive the transmission device 160 jointed therewith, and thereby drives the second tubular electrode 130, the nozzle 181 and the gas ejection port 190 into rotation. Certainly, the transmission device 160 may also use a magnetic drive member (not shown) to drive the second tubular electrode 130, the nozzle 181 and the gas ejection port 190 to rotate circumferentially in relative to the casing 110, but the invention is not limited thereto.

As a result, the plasma AC and the second gas CG, when being respectively guided to the nozzle 181 and the gas ejection port 190, may further be guided to the surface of the object being treated OB via the nozzle 181 and the gas ejection port 190, so as to perform the plasma treatment to the object being treated OB, and the second gas CG may be used to attain an effect of cooling the surface of the object being treated OB. Further details, accompanied by FIG. 2A to FIG. 3D, regarding the implementation of possible gas shapes of the plasma AC and the second gas CG as they are being guided to the surface of the object being treated OB are provided in the following.

Figure 2A:
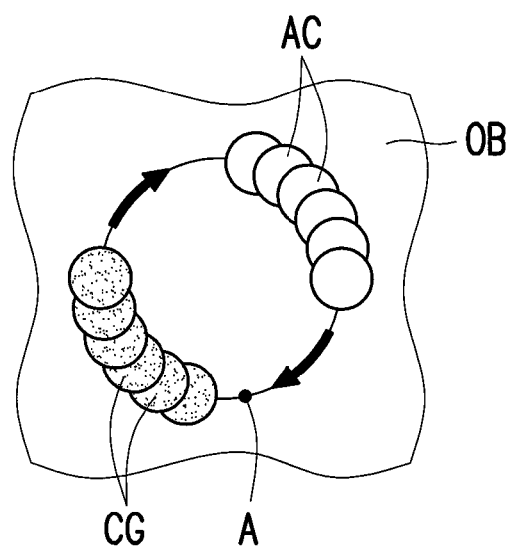
FIG. 2A is a gas shape schematic diagram illustrating the plasma of FIG. 1 performing a surface treatment to a fixed point of a stationary object being treated.
Figure 2B:
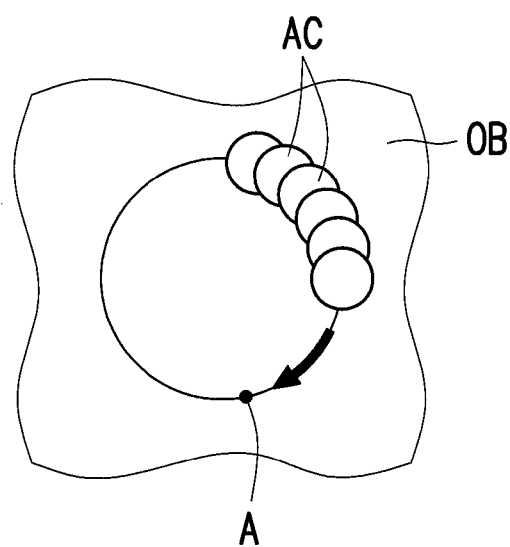
FIG. 2B is a gas shape schematic diagram illustrating a plasma performing a surface treatment to a fixed point of a stationary object being treated according to a comparative example of the invention.
Figure 2C:
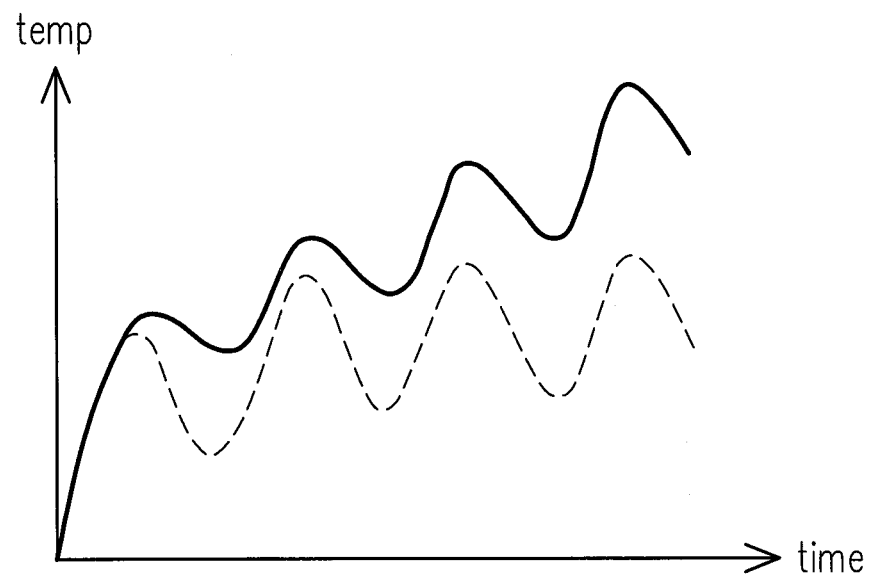
FIG. 2C is a schematic diagram illustrating temperature variation curves of the fixed points shown in FIG. 2A and FIG. 2B relative to treating time.

FIG. 2A is a gas shape schematic diagram illustrating the plasma of FIG. 1 performing a surface treatment to a fixed point of a stationary object being treated. FIG. 2B is a gas shape schematic diagram illustrating a plasma performing a surface treatment to a fixed point of a stationary object being treated according to a comparative example of the invention. FIG. 2C is a schematic diagram illustrating temperature variation curves of the fixed points shown in FIG. 2A and FIG. 2B. Referring to FIG. 2A relative to treating time, in the present embodiment, the plasma AC and the second gas CG may respectively be guided onto surfaces at opposite sides of the surface of the object being treated OB, and respectively perform the plasma treatment to the object being treated OB and provide the air cooling effect. In more detail, as shown in FIG. 2A, after the plasma AC performs the treatment to a fixed point A of the surface of the object being treated OB, as the nozzle 181 and the gas ejection port 190 rotate periodically, the second gas CG may also provide the air cooling effect after being guided to the fixed point A of the surface of the object being treated OB, thereby effectively lowering the temperature at the fixed point A of the surface of the object being treated OB.

On the other hand, as shown in FIG. 2B, when the plasma device 100 only provides the plasma treatment but not the second gas CG, the temperature at the fixed point A of the surface of the object being treated OB gradually rises as treatment time grows. As such, the temperature at the surface of the object being treated OB would rise improperly, and even cause damages to the object being treated OB, more particularly, to an object being treated OB having heat sensitive nature. In addition, improper rise of the temperature would also influence the performance of the surface treatment to the object being treated OB.

Furthermore, as shown in FIG. 2C, the temperature at the fixed point A when the plasma device 100 simultaneously provides the plasma AC and the second gas CG for performing the surface treatment is significantly smaller than the temperature at the fixed point A when the plasma device 100 only provides the plasma AC for performing the surface treatment; and as the number of contacts increases, the difference becomes more obvious. It can be known from FIG. 2C, the plasma device 100 of the invention, as being disposed with the gas ejection port, may avoid a risk of influencing the performance of the plasma AC in performing the surface treatment due to the temperature of the plasma AC being too high.

On the other hand, in the previous embodiment, even though the stationary object being treated OB has been taken as an example for description; the invention is not limited thereto. Further descriptions, accompanied by FIG. 2D to FIG. 2F, are provided below with details.

Figure 2D:
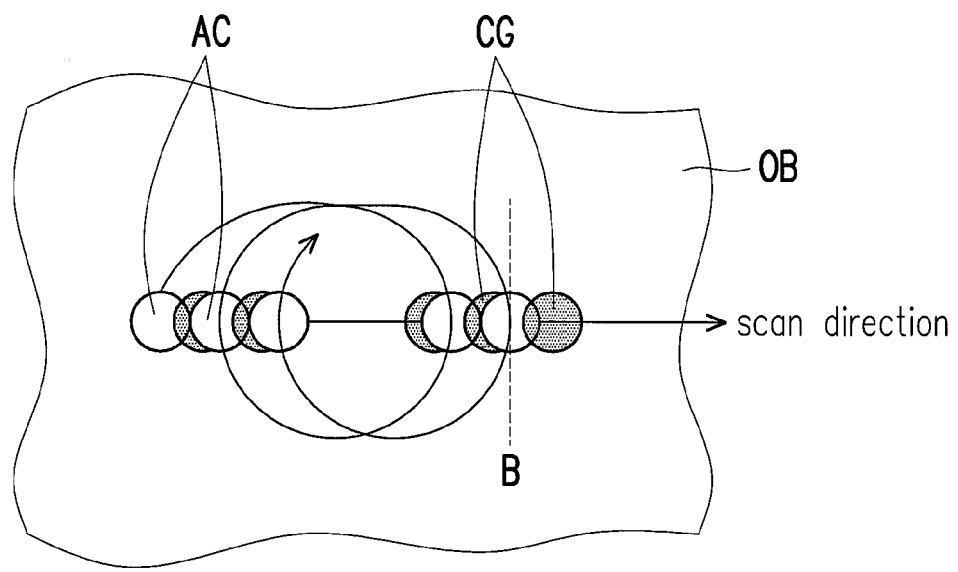
FIG. 2D is a gas shape schematic diagram illustrating the plasma of FIG. 1 performing a surface treatment to a fixed point of an object being treated that moves in relative to a scanning direction.

FIG. 2D is a gas shape schematic diagram illustrating the plasma of FIG. 1 performing a surface treatment to a fixed point of an object being treated that moves in relative to a scanning direction. FIG. 2E is a gas shape schematic diagram illustrating a plasma performing a surface treatment to a fixed point of an object being treated that moves in relative to a scanning direction according to a comparative example of the invention. FIG. 2F is a schematic diagram illustrating temperature variation curves of the fixed points shown in FIG. 2D and FIG. 2E. Referring to FIG. 2D and FIG. 2E, in the present embodiment, the plasma device 100, when performing the surface treatment to the object being treated OB, may enable the object being treated OB to perform a relative movement along a scanning direction, thereby attaining the effect of large area surface treatment. In more detail, as shown in FIG. 2D, in an embodiment, the plasma device 100 simultaneously provides the plasma AC and the second gas CG to respectively perform the plasma treatments to the object being treated so as to provide the air cooling effect, and thereby effectively lower a temperature at a fixed point B of the surface of the object being treated OB.

Figure 2E:
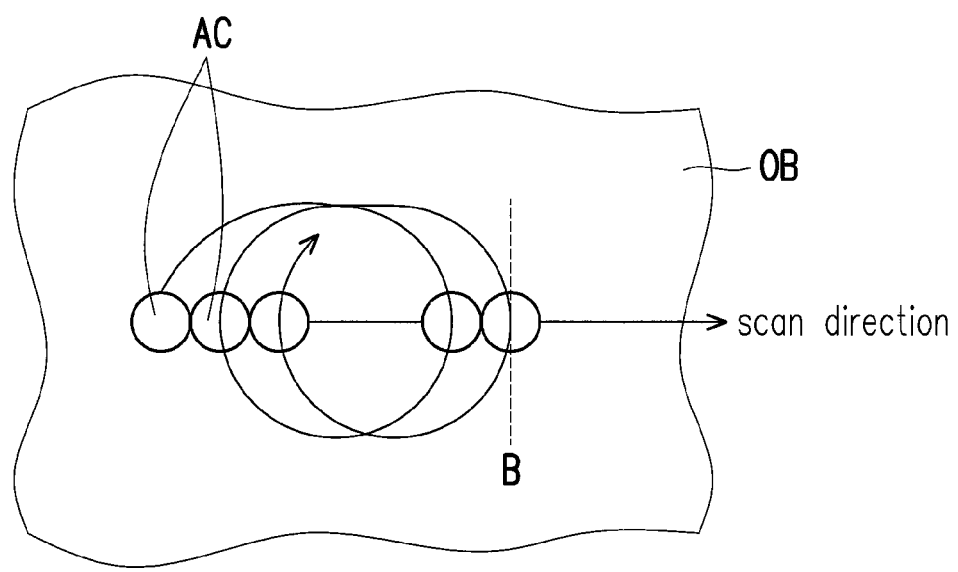
FIG. 2E is a gas shape schematic diagram illustrating a plasma performing a surface treatment to a fixed point of an object being treated that moves in relative to a scanning direction according to a comparative example of the invention.
Figure 2F:
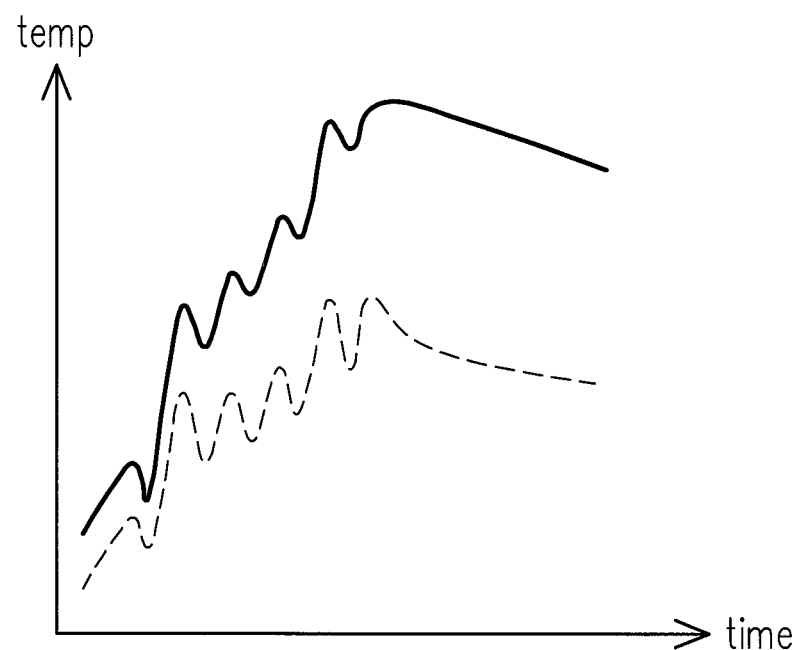
FIG. 2F is a schematic diagram illustrating temperature variation curves of the fixed points shown in FIG. 2D and FIG. 2E relative to performing time.

On the other hand, as shown in FIG. 2E, in a comparative example, the plasma device 100 only provides the plasma treatment but not the second gas CG, and thus a temperature at the fixed point B of the surface of the object being treated OB gradually rises as the treatment time grows. Hence, as shown in FIG. 2F, the temperature at the fixed point B when the plasma device 100 simultaneously provides the plasma AC and the second gas CG for performing the surface treatment is significantly smaller than the temperature at the fixed point B when the plasma device 100 only provides the plasma AC for performing the surface treatment; and as the number of contacts increases, the difference becomes more obvious. Accordingly, the plasma device 100 may rotate periodically via the nozzle 181 and the gas ejection port 190, so that the second gas CG may also be guided to the fixed point B of the surface of the object being treated OB to provide the air cooling effect later, and thereby avoid a risk of influencing the performance of the plasma AC in performing the surface treatment due to the temperature of the plasma AC being too high.

Besides, in the previous embodiment, even though the gas shape of the second gas CG has taken a dotted shape as an example for description, the invention is not limited thereto. Further descriptions, accompanied by FIG. 3A to FIG. 3D, are provided below with details.

Figure 3A:
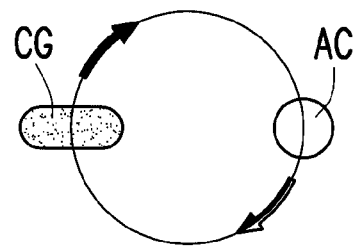
FIG. 3A to FIG. 3D are different gas shape schematic diagrams illustrating the plasma of FIG. 1 performing the surface treatment.
Figure 3B:
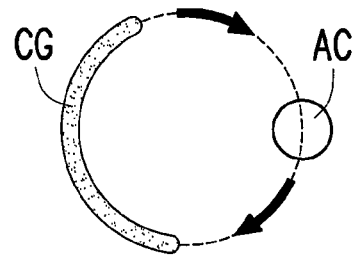
Figure 3C:
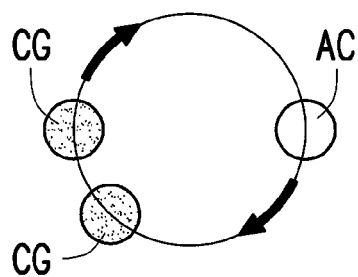

FIG. 3A to FIG. 3D are different gas shape schematic diagrams illustrating the plasma of FIG. 1 performing the surface treatment. As shown in FIG. 3A and FIG. 3B, in the present embodiment, the gas ejection port 190 may also control the gas shape of the second gas CG ejected at the surface of the object being treated OB to be long and narrow, or the gas shape of the second gas CG ejected at the surface of the object being treated OB to be an arc. In addition, as shown in FIG. 3C, in another embodiment, an amount of the gas ejection port 190 configured to eject the second gas CG is a plurality. Hence, a range of the second gas CG in performing the air cooling effect may further be expanded.

Figure 3D:
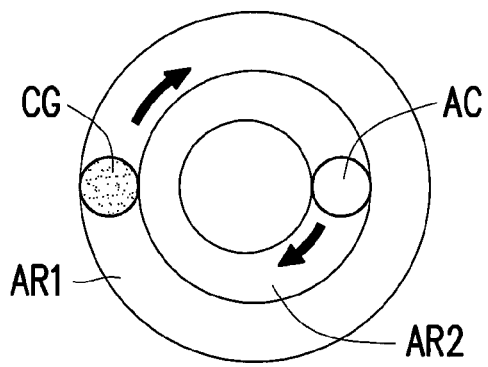

Moreover, the invention also does not limit the range of the second gas CG performing in the air cooling effect must be overlapped with a range of the plasma AC in performing the surface treatment. For example, as shown in FIG. 3D, in an embodiment, the second gas CG may be ejected along a first region AR1 on the surface of the object being treated OB, the plasma AC may be ejected along a second region AR2 on the surface of the object being treated OB, and the first region AR1 is adjacent to the second region AR2. Hence, the first region AR1 that provides the air cooling effect by using the second gas CG is adjacent to the second region AR2 that is performed with the surface treatment by the plasma AC, the plasma device 100 may also attain an effect of providing a surface cooling to the second region AR2 that is performed with the surface treatment by the plasma AC, and thereby also maintain the performance of the plasma AC in performing the surface treatment.

In other words, the invention does not limit the amount of the gas ejection port 190 and the form and the range of the gas shape of the second gas CG; in other embodiments, any plasma device 100 that can provide the air cooling effect through ejecting the second gas CG so as to avoid influence the performance of the plasma AC in performing the surface treatment may all be considered as the plasma device 100 of the present embodiment.

As a result, the plasma device 100, when ejecting the plasma AC, can enable the plasma AC and the second gas CG to be guided to the surface of the object being treated OB via the nozzle 181 and the gas ejection port 190, and simultaneously attain the effect of large area surface treatment via the movement of the object being treated OB. Moreover, the plasma device 100 can also attain an effect of cooling the surface of the object being treated by using the second gas CG, and thereby avoid a risk of influencing the performance of the plasma AC in performing the surface treatment due to the temperature of the plasma AC being too high. In addition, the plasma device 100 can also cool down the first tubular electrode 120 with the injection and the flowing of the first gas WG, so as to provide the air cooling effect, thereby effectively lowering the working temperature of the first tubular electrode 120 and thus effectively prolonging the service life of the first tubular electrode 120.

Besides, in the previous embodiment, although the second gas CG is, for example, described as to enter the chamber 121 from one of the at least one intake ports IP1 and be ejected after being guided to the gas ejection port 190 through the second gas channel GC2, the invention is not limited thereto. Further descriptions, accompanied by FIG. 4 to FIG. 8B, are provided below with details.

Figure 4:
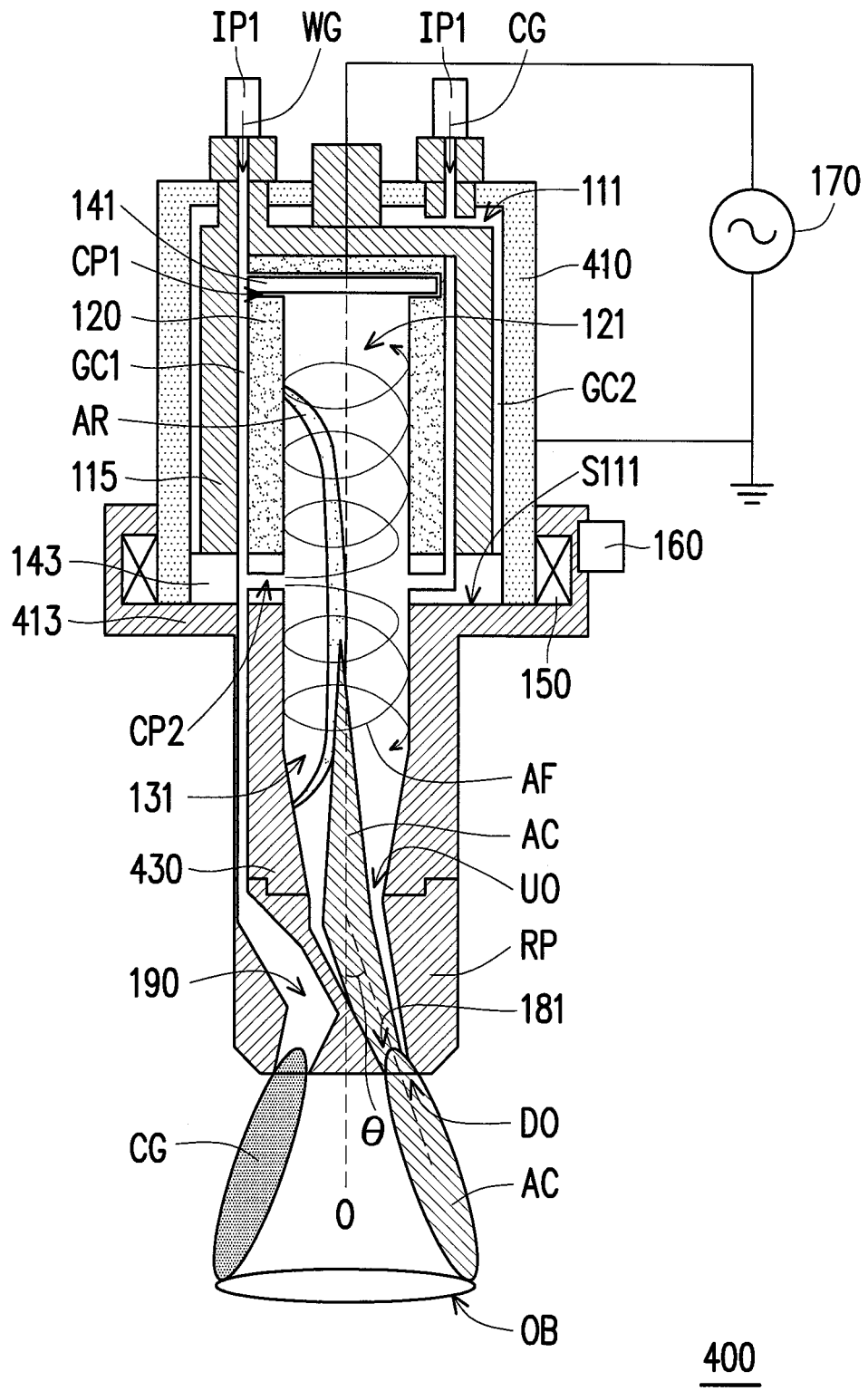
FIG. 4 is a schematic diagram illustrating architecture of a plasma device according to another embodiment of the invention.

FIG. 4 is a schematic diagram illustrating architecture of a plasma device according to another embodiment of the invention. Referring to FIG. 4, in the present embodiment, a plasma device 400 of FIG. 4 is similar to the plasma device 100 of FIG. 1, except that, in the embodiment as shown in FIG. 4, the plasma device 400 omits the airflow shroud 116 (illustrated in FIG. 1) of the casing 110 of the plasma device 100, such that the casing 410 merely extends from the upper bottom 413 above the second tubular electrode 430. As shown in FIG. 4, in the present embodiment, the first gas channel GC1 is directly located within the second tubular electrode 430, and thus is connected with the inside of the gas ejection port 190. Therefore, the present embodiment may omit the design of the shroud 116 as illustrated in FIG. 1, and may be conducive in simplifying the components of the plasma device. In the present embodiment, the second gas CG may enter the chamber 121 and the chamber 131 from the at least one intake port IP1, and may be ejected after being guided to the gas ejection port 190 through the first gas channel GC1 or the second gas channel GC2, which is connected with the first gas channel GC1, so as to lower the temperature at the surface of the object being treated OB.

Similarly, the plasma device 400 can also cool down the first tubular electrode 120 and the second tubular electrode 130 with the injections and the flowings of the first gas WG and the second gas CG, so as to provide an air cooling effect for effectively lowering the working temperatures of the electrodes during the plasma treatment, and thus may effectively stabilize and enhance the performance of the plasma and prolong the service lives of the electrodes. Moreover, when the plasma AC is ejected, the plasma device 400 can also enable the plasma AC and the second gas CG to be guided to the surface of the object being treated OB via the nozzle 181 and the gas ejection port 190, and simultaneously attain the effect of large area surface treatment via the movement of the object being treated OB. In addition, the plasma device 400 can also attain the effect of cooling the surface of the object being treated by using the second gas CG, and thereby avoid a risk of influencing the temperature of the plasma AC in performing the surface treatment due to the temperature of the plasma AC being too high. Thus, the plasma device 400 also has the same benefits provided by the plasma device 100, and no further elaboration will be provided herein.

Figure 5:
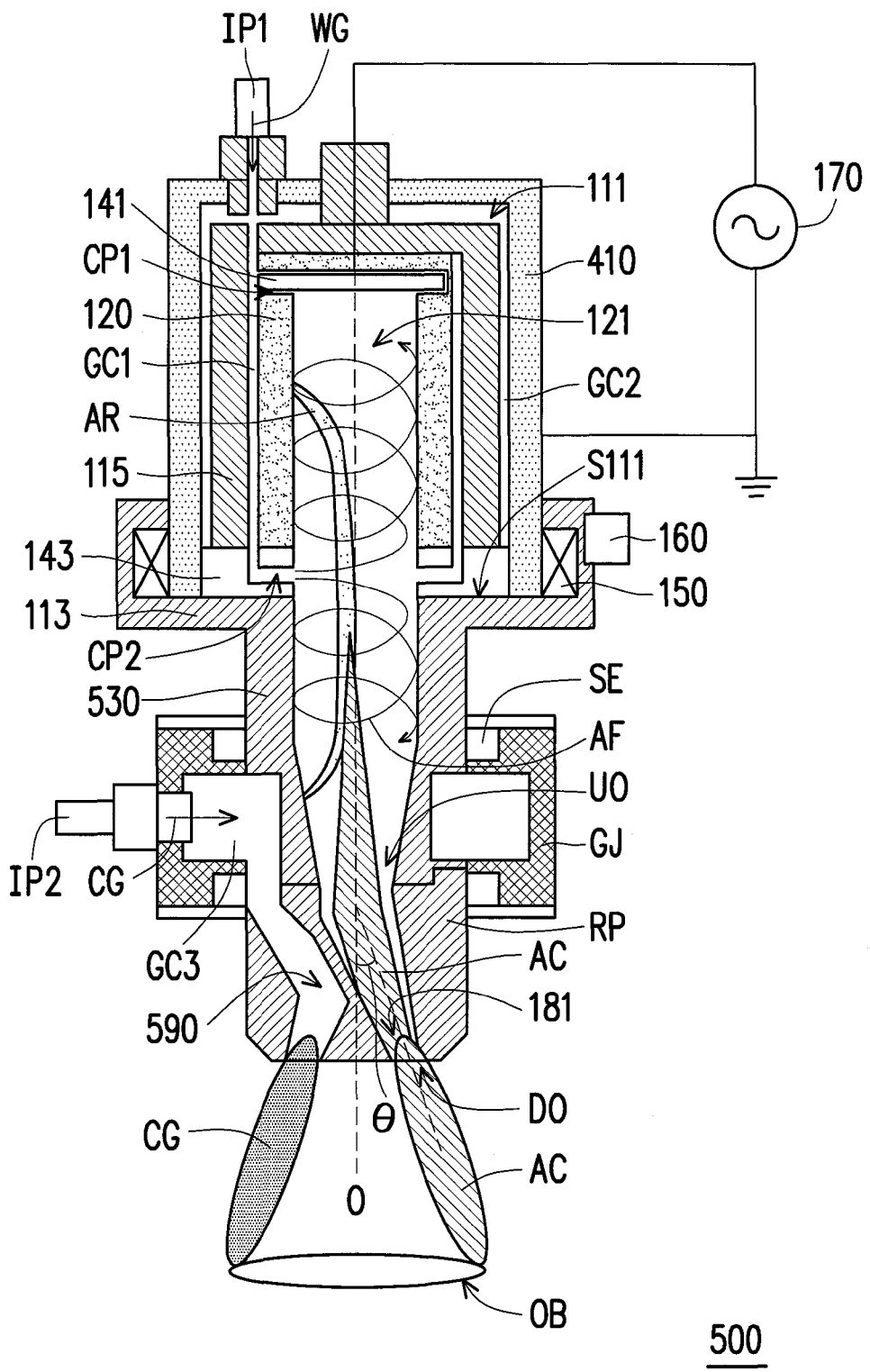
FIG. 5 is a schematic diagram illustrating architecture of a plasma device according to yet another embodiment of the invention.

FIG. 5 is a schematic diagram illustrating architecture of a plasma device according to yet another embodiment of the invention. Referring to FIG. 5, in the present embodiment, a plasma device 500 of FIG. 5 is similar to the plasma device 100 of FIG. 1, except that, in the embodiment as shown in FIG. 5, the plasma device 500 further includes at least one intake port IP2 and a gas valve shell GJ, wherein the at least one intake port IP2 is disposed on the second tubular electrode 530 through the gas valve shell GJ. In detail, the at least one intake port IP2 is connected with the gas sources from the outside, and a third gas channel GC3 is formed between the gas valve shell GJ and the gas ejection port 590 for the second gas to pass through. Specifically, the second gas CG may be injected from the at least one intake port IP2, and then be ejected from an opening at the bottom of the second tubular electrode 530 after being guided to the gas ejection port 590 through the third gas channel GC3.

On the other hand, in the present embodiment, the gas valve shell GJ and the second tubular electrode 530 may be separately disposed. For example, the gas valve shell GJ may be rotatably disposed on the tubular electrode 530 via a shaft bearing method, and thus may remain stationary when the rotating portion RP of the second tubular electrode 530 rotates. Now, a plurality of sealing elements SE may be disposed between the gas valve shell GJ and the second tubular electrode 530, so as to prevent the second gas CG from escaping. In the present embodiment, a material of the sealing elements SE may, for example, be rubber, graphite or machinable ceramic, but the invention is not limited thereto. In another embodiment, the sealing elements SE may also be graphite rings with lubrication function. Now, the sealing elements SE may control an escape ratio of the second gas CG to be in a permissible range, and may further be conducive in reducing a possible risk of wearing the gas valve shell GJ as the rotating portion RP of the second tubular electrode 530 rotates.

Moreover, in the present embodiment, the third gas channel GC3, instead of being connected with each chamber, the first gas channel GC1 and the second gas channel GC2, may be an independent gas channel. Therefore, the second gas CG and the first gas WG may be independently controlled as a same or different type of second gas CG, wherein the second gas CG may selectively be an inert gas or other proper gas, which does not react with the first gas WG, according to the actual requirements, so as to reduce the chance of mixing the plasma AC with the outside air. For example, when performing a reduction treatment, the first gas WG may selectively be nitrogen mixed with hydrogen ($N_2+H_2$) while the second gas CG may selectively be nitrogen ($N_2$), and thus the chance of mixing the oxygen in the outside air with the plasma AC, thereby enhancing the performance of the treatment, but the invention is not limited thereto.

In other embodiment, the second gas CG, in addition to having the air cooling effect, may also selectively be a reactive second gas CG or a gas mixture, so that the plasma AC and the second gas CG perform the surface treatment to the object being treated OB after undergoing further reactions; for example, reactions, such as coating or etching, required between the second gas CG and the surface of the object being treated OB surface may be enhanced after the surface of the object being treated OB is activated by the plasma AC. For example, in some embodiments, the second gas CG may perform a coating process or an etching process to the object being treated, and simultaneously provide the air cooling effect as a cold gas. Those skilled in the art should be able to select a proper type of gas for the second gas CG based on the actual requirements, and thus no further elaboration will be provided herein.

Similarly, the plasma device 500 as similar to the plasma devices 100 and 400 may also provide the air cooling effect to the electrodes. Moreover, when the plasma AC is ejected, the plasma device 500 can also enable the plasma AC and the second gas CG be guided to the surface of the object being treated OB via the nozzle 181 and the gas ejection port 590, and simultaneously attain the effect large area surface treatment via the movement of the object being treated OB. At the same time, the plasma device 500 can also attain the effect of cooling the surface of the object being treated by using the second gas CG, and thereby avoid a risk of influencing the performance of the plasma AC in performing the surface treatment due to the temperature of the plasma AC being too high; no further elaboration will be provided herein.

In the previous embodiments, although the plasma AC and the second gas CG are, for example, described as to be guided to the opposite sides of the surface of the object being treated OB, the invention is not limited thereto. Further descriptions, accompanied by FIG. 6 to FIG. 7, are provided below with details.

Figure 6:
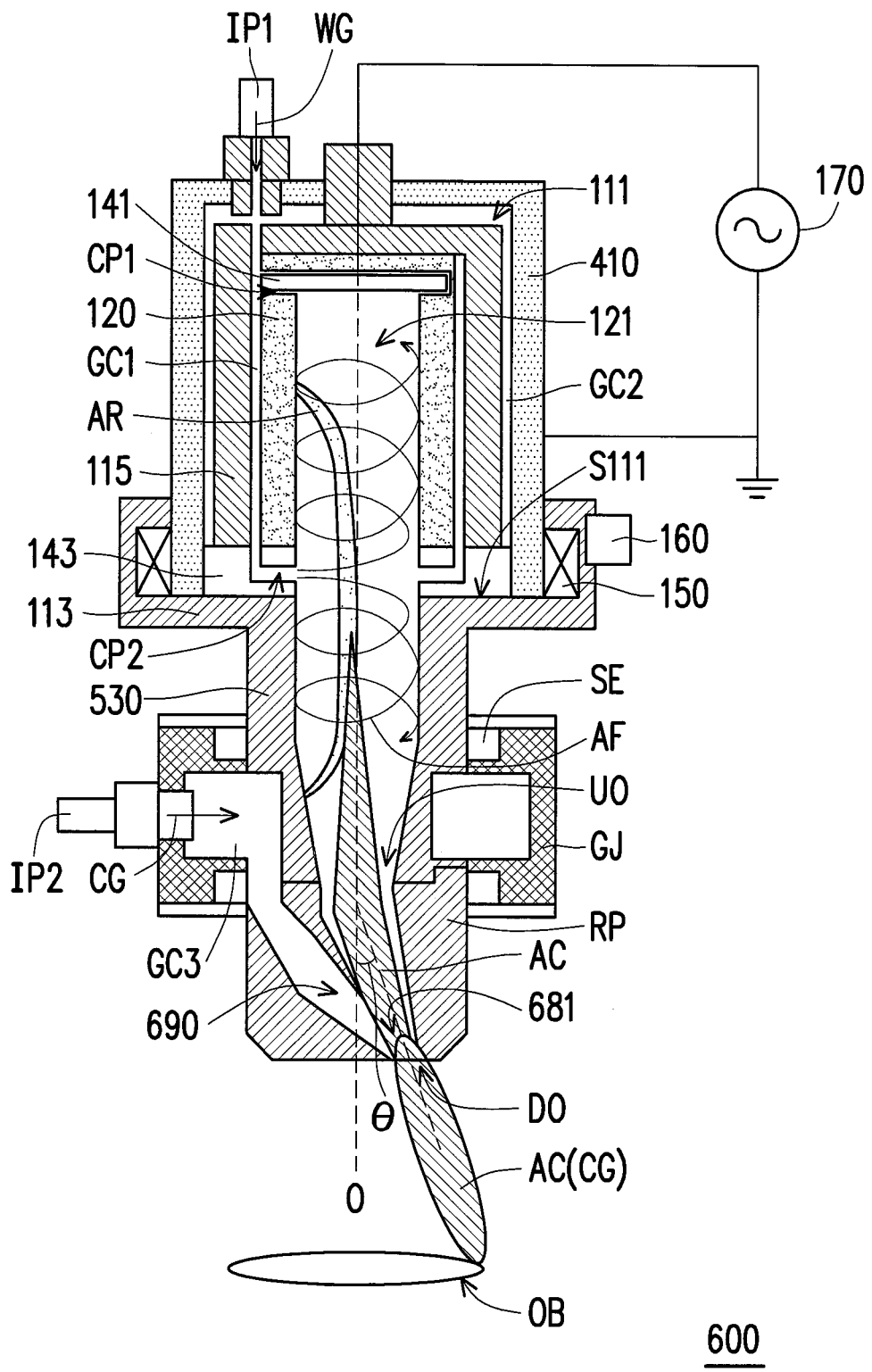
FIG. 6 is a schematic diagram illustrating architecture of a plasma device according to still another embodiment of the invention.

FIG. 6 is a schematic diagram illustrating architecture of a plasma device according to still another embodiment of the invention. Referring to FIG. 6, in the present embodiment, a plasma device 600 of FIG. 6 is similar to the plasma device 500 of FIG. 5, except that, in the embodiment as shown in FIG. 6, the gas ejection port 690 and the nozzle 681 are jointed with each other within the bottom of the second tubular electrode 530, so as to enable the plasma AC and the cooled second gas CG to be ejected from a same outlet at the bottom of the second tubular electrode 530. In other words, this outlet supplies the plasma and the cold gas CG simultaneously. In the present embodiment, the plasma AC and the second gas CG may be guided to a same side at the surface of the object being treated OB via the same nozzle 681 guided, and thus may perform the plasma treatment to the object being treated and provide the air cooling effect. This configuration may be adapted for a process whereby the cold gas CG and the plasma AC may perform a surface treatment to the object being treated OB after being mix reacted with each other; and certainly, the cold gas CG may also only be used to lower the temperature of the surface of the object being treated OB that is treated by the plasma AC, and the invention is not limited thereto.

Figure 7:
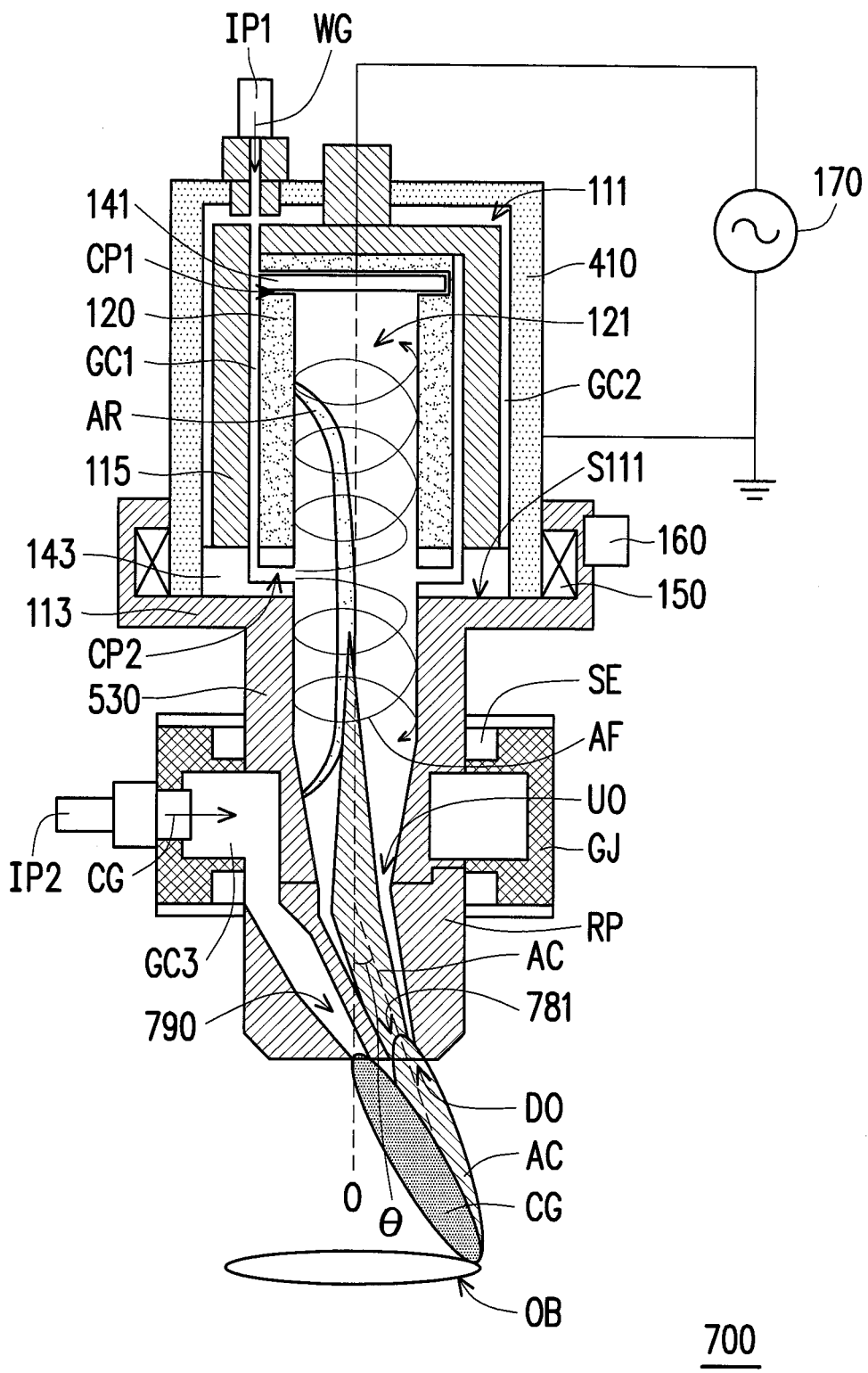
FIG. 7 is a schematic diagram illustrating architecture of a plasma device according to further another embodiment of the invention.

FIG. 7 is a schematic diagram illustrating architecture of a plasma device according to further another embodiment of the invention. Referring to FIG. 7, in the present embodiment, a plasma device 700 of FIG. 7 is also similar to the plasma device 500 of FIG. 5, except that, in the embodiment as shown in FIG. 7, the outlets of the nozzle 181 and the gas ejection port 790 are different openings at a same side of the bottom of the second tubular electrode 530, so that the plasma AC and the second gas CG may be guided from the different openings at the bottom of the second tubular electrode 530 to a same side of the surface of the object being treated OB, and thus may perform the plasma treatment to the objected being treated and provide the air cooling effect.

In the previous embodiments, since the plasma devices 600 and 700 can also cool down the first tubular electrode 120 with the injection and the flowing of the first gas WG, thereby providing the air cooling effect and effectively lowering the working temperature of the first tubular electrode 120, the service life of the first tubular electrode 120 can effectively be prolonged. Moreover, when the plasma AC is ejected, the plasma devices 600 and 700 can also enable the plasma AC and the second gas CG to be guided to the surface of the object being treated OB respectively via the nozzles 681 and 781 and the gas ejection ports 690 and 790, and simultaneously attain the effect of large area surface treatment via the movement of the object being treated OB. In addition, the plasma devices 600 and 700 can also attain the effect of cooling the surface of the object being treated by using the second gas CG, and thereby avoid a risk of influencing the performance of the plasma AC in performing the surface treatment due to the temperature of the plasma AC being to high. Thus, the plasma devices 600 and 700 also have the same benefits provided by the plasma device 500, and no further elaboration will be provided herein.

Figure 8A:
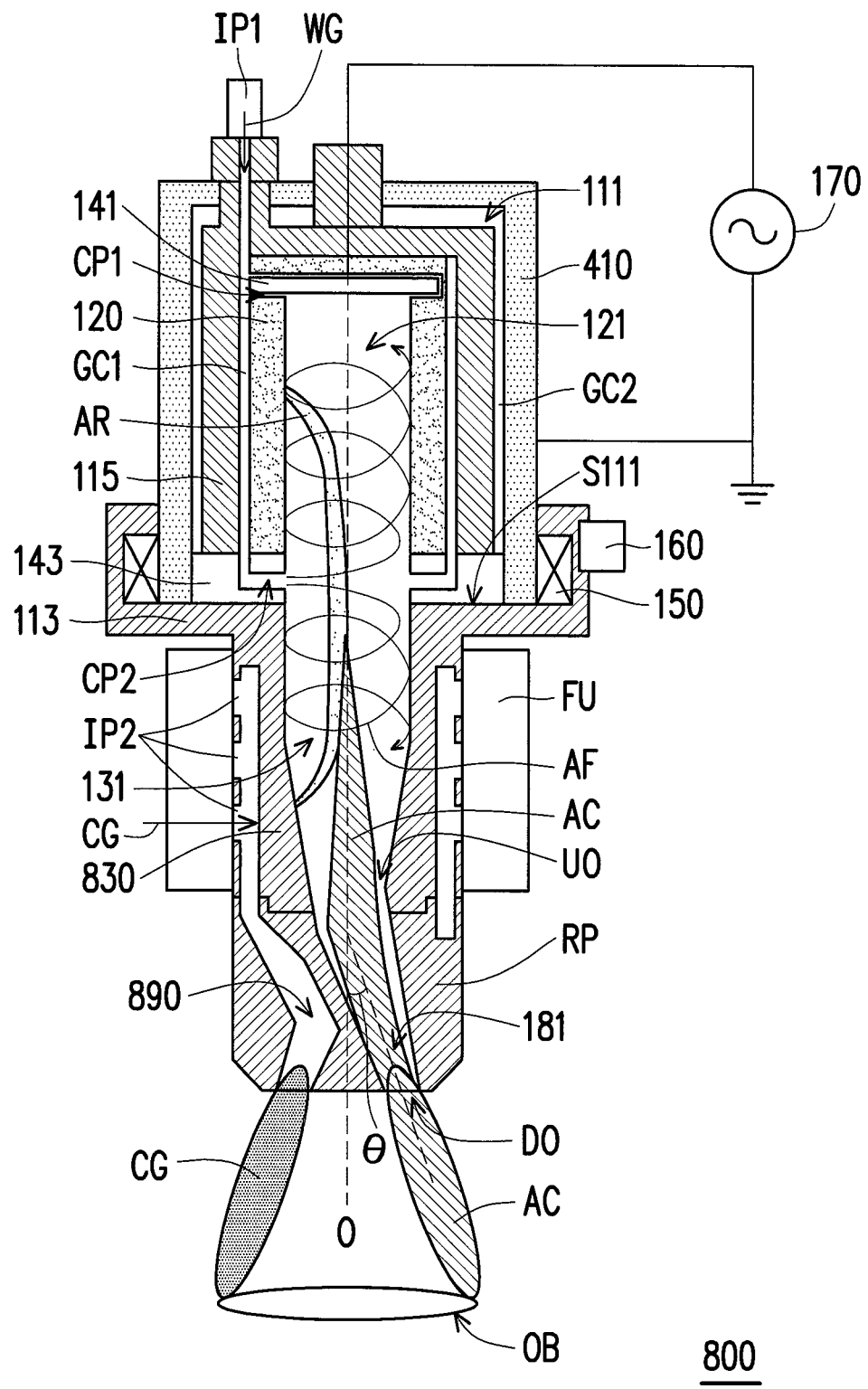
FIG. 8A is a schematic diagram illustrating architecture of a plasma device according to an embodiment of the invention.
Figure 8B:
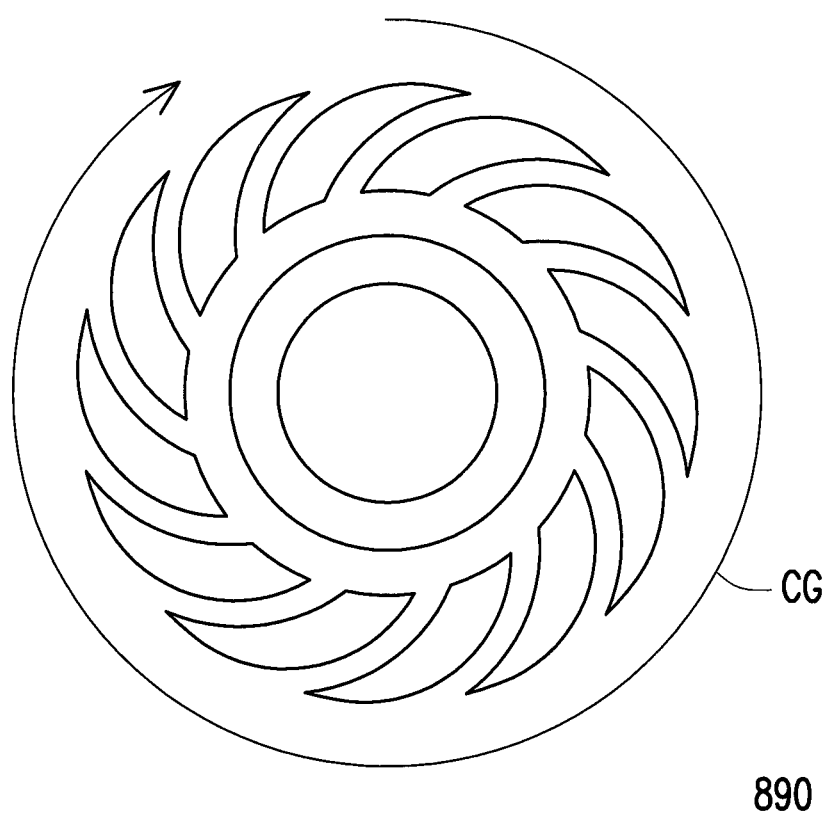
FIG. 8B is a front view schematic diagram illustrating a heat dissipation blade unit shown in FIG. 8A.

FIG. 8A is a schematic diagram illustrating architecture of a plasma device according to an embodiment of the invention. FIG. 8B is a front view schematic diagram illustrating a heat dissipation blade unit shown in FIG. 8A. Referring to FIG. 8A and FIG. 8B, in the present embodiment, a plasma device 800 of FIG. 8A is similar to the plasma device 500 of FIG. 5, wherein a different therebetween is described as follows. As shown in FIG. 8A and FIG. 8B, in the present embodiment, the plasma device 800 further includes a heat dissipation blade unit FU. The heat dissipation blade unit FU is disposed on the second tubular electrode 830, wherein the second gas CG is absorbed by the heat dissipation blade unit FU and is guided into the at least one intake port IP2. In more detail, with the configuration of the heat dissipation blade unit FU, the temperature of the second gas CG that flows into the at least one intake port IP2 and the third gas channel GC3 may be lowered, thereby attaining a more effective air cooling effect.

In the present embodiment, since the plasma device 800 can also cool down the first tubular electrode 120 with the injection and the flowing of the first gas WG, thereby providing the air cooling effect and effectively lowering the working temperature of the first tubular electrode 120, the service life of the first tubular electrode 120 can effectively be prolonged. Moreover, when the plasma AC is ejected, the plasma device 800 can also enable the plasma AC and the second gas CG to be guided to the surface of the object being treated OB via the nozzle 181 and the gas ejection port 890, and simultaneously attain the effect of large area surface treatment via the movement of the object being treated OB. In addition, the plasma device 800 can also attain the effect of cooling the surface of the object being treated by using the second gas CG, and thereby avoid a risk of influencing the performance of the plasma AC in performing the surface treatment due to the temperature of the plasma AC being too high. Thus, the plasma device 800 also has the same benefits provided by the plasma device 500, and no further elaboration will be provided herein.

In summary, the plasma device of the invention can cool down the first tubular electrode with the injection and the flowing of the working gas, and thus can provide the air cooling effect, thereby effectively prolonging the service life of the first tubular electrode. Moreover, when the plasma is ejected, the plasma device can also enable the plasma and the gas to be guided to the surface of the object being treated via the nozzle, and simultaneously attain the effect of large area surface treatment via the movement of the object being treated. In addition, the plasma device can also attain the effect of cooling the surface of the object being treated by using the gas, and thereby avoid a risk of influencing the performance of the plasma in performing the surface treatment due to the temperature of the plasma being too high.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A plasma device, comprising:
a first electrode;
a second electrode, disposed corresponding to the first electrode, wherein the second electrode is capable of rotating in relative to the first electrode, and a plasma is adapted to be formed between the first electrode and the second electrode; and
a nozzle and a gas ejection port, independently disposed at the bottom of the second electrode respectively, wherein the nozzle is configured to eject the plasma, and forms an included angle with or is spaced a distance apart from a rotating axis of the second electrode, and the gas ejection port is configured to eject a cold gas.

2. The plasma device as recited in claim 1, further comprising:
a casing, having a first chamber,
the first electrode being disposed in the first chamber, and the first electrode being a first tubular electrode, wherein the first tubular electrode has a second chamber; and
the second electrode being a second tubular electrode, wherein the second tubular electrode has a third chamber connected with the second chamber, the second chamber and the third chamber are adapted for accommodating the plasma, and the second electrode is capable of rotating in relative to the casing.

3. The plasma device as recited in claim 2, further comprising:
an insulating lining, located between the first tubular electrode and the casing;
a first gas channel, formed between the insulating lining and the first tubular electrode, and adapted for a first gas to pass through; and
a first swirling flow generator, disposed at a joint between the first tubular electrode and the second tubular electrode, wherein the first swirling flow generator comprises at least one first connection port, the at least one first connection port is configured to guide the first gas into the second chamber and the third chamber and to generate a swirling flow in the second and the third chambers, and the swirling flow pushes an arc root formed within the first tubular electrode and the second tubular electrode to enable the arc root to perform a spiral motion at internal surfaces of the first tubular electrode and the second tubular electrode.

4. The plasma device as recited in claim 3, wherein the first gas channel further extends to and between the second tubular electrode and the casing, so as to connect with the gas ejection port.

5. The plasma device as recited in claim 3, further comprising:
a second gas channel, formed between the casing and the insulating lining, and adapted for a second gas to pass through, wherein the second gas channel further extends to and between the second tubular electrode and the casing and is connected with the gas ejection port.

6. The plasma device as recited in claim 5, wherein the first gas and the second gas are a same gas, and the plasma device further comprises:
a swirling flow distributor, located in a transmission path of the first gas and the second gas within the first gas channel and the second gas channel, for regulating a ratio between the cold gas ejected from the gas ejection port and the working gas that enters into the second chamber and the third chamber.

7. The plasma device as recited in claim 3, further comprising:
at least one intake port, disposed on the second tubular electrode and connected with the gas ejection port; and
a gas valve shell, wherein the at least one intake port is disposed on the second tubular electrode through the gas valve shell, and a third gas channel is formed between the at least one intake port and the gas ejection port.

8. The plasma device as recited in claim 7, further comprising:
a heat dissipation blade unit, disposed on the second tubular electrode, wherein the cold gas is injected by the heat dissipation blade unit and then guided into the at least one intake port.

9. The plasma device as recited in claim 3 being adapted to perform a treatment to an object being treated, wherein the nozzle and the gas ejection port are different openings at a same side of the bottom of the second tubular electrode, and the plasma and the cold gas contact with the outside and mix with each other through the different openings at the bottom of the second tubular electrode.

10. The plasma device as recited in claim 3 being adapted to perform a treatment to an object being treated, wherein the gas ejection port and the nozzle engage with each other within the bottom of the second tubular electrode, so as to enable the plasma and the cold gas to flow together to the nozzle at the bottom of the second tubular electrode and to be ejected from a same outlet, and the plasma and the cold gas are guided to a surface of the object being treated through the same outlet.

11. The plasma device as recited in claim 3, further comprising:
a second swirling flow generator, covering on the first tubular electrode, and the first tubular electrode being jointed to the second swirling flow generator, wherein the second swirling flow generator comprises at least one second connection port configured to guide the working gas within the first gas channel into the second chamber via a tangential path.

12. The plasma device as recited in claim 1, wherein the second electrode is jointed to an external side face at the bottom of the casing through a shaft bearing, the nozzle is fixed on a rotating portion of the second electrode, and the rotating portion of the second electrode and the nozzle rotate around the casing.

13. The plasma device as recited in claim 1, further comprising:
   a transmission device, installed on an external side face of the second electrode, for driving the second electrode and the nozzle into rotation.

14. A plasma device, comprising:
   a casing, having a first chamber;
   a first tubular electrode, disposed in the first chamber and having a second chamber;
   a second tubular electrode, having a third chamber connected with the second chamber, wherein the second tubular electrode is capable of rotating in relative to the casing, and the second chamber and the third chamber are adapted for accommodating a plasma formed between the first tubular electrode and the second tubular electrode; and
   a nozzle and a gas ejection port, independently disposed at the bottom of the second tubular electrode respectively, wherein the nozzle is configured to eject the plasma, and forms an included angle with or is spaced a distance apart form a rotating axis of the second tubular electrode, and the gas ejection port is configured to eject a cold gas.

15. The plasma device as recited in claim 14, further comprising:
   a transmission device, installed on an external side face of the second tubular electrode for driving the second tubular electrode and the nozzle into rotation.

* * * * *